United States Patent
Behzad et al.

(10) Patent No.: US 7,359,170 B2
(45) Date of Patent: Apr. 15, 2008

(54) RF CIRCUIT ELECTROSTATIC DISCHARGE PROTECTION

(75) Inventors: Arya Reza Behzad, Poway, CA (US); Agnes N. Woo, Encino, CA (US); Victor Fong, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 440 days.

(21) Appl. No.: 10/972,102

(22) Filed: Oct. 22, 2004

(65) Prior Publication Data

US 2005/0087887 A1  Apr. 28, 2005

Related U.S. Application Data

(60) Provisional application No. 60/573,668, filed on May 21, 2004, provisional application No. 60/515,218, filed on Oct. 28, 2003, provisional application No. 60/513,456, filed on Oct. 22, 2003.

(51) Int. Cl.
*H02H 3/00* (2006.01)
(52) U.S. Cl. ........................................ 361/56
(58) Field of Classification Search ................. 361/56
See application file for complete search history.

(56) References Cited

U.S. PATENT DOCUMENTS

| | | | |
|---|---|---|---|
| 5,255,146 A * | 10/1993 | Miller | 361/56 |
| 6,198,163 B1 * | 3/2001 | Crowley et al. | 257/706 |
| 6,353,520 B1 * | 3/2002 | Andresen et al. | 361/56 |
| 6,885,534 B2 * | 4/2005 | Ker et al. | 361/113 |

* cited by examiner

*Primary Examiner*—Ronald W. Leja
(74) *Attorney, Agent, or Firm*—Garlick Harrison & Markison

(57) ABSTRACT

A padring formed on a semi conductive substrate die provides Electro Static Discharge (ESD) protection for a Radio Frequency (RF) circuit also formed on the semi conductive substrate die. The padring includes a voltage supply rail, a ground rail, a plurality of signal pad structures, and a plurality of voltage clamps. The plurality of signal pad structures are disposed between the voltage supply rail and the ground rail. Each signal pad structure includes a signal pad that couples to the RF circuit, a voltage supply path diode disposed between and coupled between the signal pad and the voltage supply rail, and a ground path diode disposed between and coupled between the signal pad and the voltage supply rail. The plurality of voltage clamps are disposed between and coupled between the voltage supply rail and the ground rail.

8 Claims, 10 Drawing Sheets

RF CIRCUIT ELECTROSTATIC DISCHARGE PROTECTION

CROSS REFERENCE TO RELATED APPLICATIONS

This application claims priority to U.S. Provisional Patent Application Ser. No. 60/513,456, filed Oct. 22, 2003, to U.S. Provisional Patent Application Ser. No. 60/515,218, filed Oct. 28, 2003, and to U.S. Provisional Patent Application Ser. No. 60/573,668, filed May 21, 2004, all of which are incorporated herein by reference for all purposes.

BACKGROUND

1. Technical Field

This invention relates generally to communication systems and more particularly to Electrostatic Discharge Circuits used to protect Radio Frequency transceivers within such communication systems.

2. Related Art

Communication systems are known to support wireless and wire lined communications between wireless and/or wire lined communication devices. Such communication systems range from national and/or international cellular telephone systems to the Internet to point-to-point in-home wireless networks. Communication systems typically operate in accordance with one or more communication standards. For instance, wired communication systems may operate according to one or more versions of the Ethernet standard, the System Packet Interface (SPI) standard, or various other standards. Wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). Typically, the transceiver includes a data modulation stage (baseband processor) and an RF stage. The baseband processor converts between data and baseband signals in accordance with the particular wireless communication standard. The RF stage converts between baseband signals and RF signals. The RF stage may be a direct conversion transceiver that converts directly between baseband and RF or may include one or more intermediate frequency stages.

In some constructs, the RF stage is formed on a single semi conductive substrate die. In other constructs, the RF stage is formed in conjunction with a baseband processor on a single semi conductive substrate die. In either case, prior to packaging of the single semi conductive substrate die, signal pads of the RF stage are susceptible to Electro Static Discharge (ESD). ESD protection is essential for protection of the circuitry of the RF stage that is exposed by the signal pads. This ESD protection must minimally load the signal pads while providing excellent ESD protection. Meeting this combination of requirements is difficult. As processing dimensions become smaller, challenges in meeting these requirements becomes greater.

These ESD protection requirements are not limited to RF circuits, however. Any circuits that operate upon information signals and that have signal or tuning pads exposed on the semi conductive die have these same or similar requirements. With some of these circuits, a first group of circuit elements are formed on the semi conductive die while other circuit components are formed as external components, e.g., package components. It is also difficult to protect these types of circuits from ESD events prior to packaging. Thus, these types of circuits have significant ESD protection requirements.

BRIEF SUMMARY OF THE INVENTION

In order to meet the above-described shortcomings, among others of the prior devices, a padring formed on a semi conductive substrate die provides Electro Static Discharge (ESD) protection for a Radio Frequency (RF) circuit also formed on the semi conductive substrate die. The padring includes a voltage supply rail, a ground rail, a plurality of signal pad structures, and a plurality of voltage clamps. Each signal pad structure is disposed between the voltage supply rail and the ground rail and includes a signal pad, a voltage supply path diode, and a ground path diode. The signal pad couples to the RF circuit. The voltage supply path diode is disposed between and coupled between the signal pad and the voltage supply rail. The ground path diode is disposed between and coupled between the signal pad and the voltage supply rail. Each voltage clamp is disposed between and coupled between the voltage supply rail and the ground rail.

In some embodiments, each signal pad structure has a corresponding voltage clamp formed adjacent thereto. At least one of the ground path diode and the voltage supply path diode may be an NDIO diode having an N+ contact formed in P type well. Alternately, at least one of the ground path diode and the voltage supply path diode may be an NDIO diode having an N+ contact formed in P type substrate. Further, at least one of the ground path diode and the voltage supply path diode may be a PDIO diode having an P+ contact formed in N type well. Each voltage clamp may include a plurality of transistors coupled between the voltage supply rail and the ground rail. Each of the transistors may be an NMOS transistor.

In one particular construct of the voltage supply rail, the voltage supply rail resides on an outer perimeter of the semi conductive substrate die while the ground rail resides on an inner perimeter of the padring. The voltage supply path diode and the ground path diode may be selected to meet a predetermined parasitic capacitance budget at the signal pad. Further, the voltage supply path diode and the ground path diode may be selected to meet a maximum conductive resistance budget.

According to another embodiment of the present invention, an ESD protection system protects an integrated circuit that is formed on a semi conductive substrate die. The ESD protection system includes a plurality of power domains and a plurality of downbonds. A downbond is a bond wire that attaches between a pad opening on a die to a reference plane on a package. The reference plane is often a ground plane, also commonly known as a heat slug for its heat dissipation characteristics. Each power domain corresponds to a respective portion of the integrated circuit and includes a voltage supply rail, a ground rail, a plurality of signal pad structures, and at least one voltage clamp. Each signal pad structure includes a signal pad that couples to the RF circuit, a voltage supply path diode coupled to the signal pad and to the voltage supply rail, a ground path diode coupled to the signal pad and to the ground rail, and at least one voltage clamp coupled to the voltage supply rail and the ground rail. Each of the plurality of downbonds couples the ground rail of a respective power domain to a package conductive plane of a package upon which the integrated circuit is mounted such that the ground rails of the plurality of power domains couple via the package conductive plane.

Other features and advantages of the present invention will become apparent from the following detailed description of the invention made with reference to the accompanying drawings.

DETAILED DESCRIPTION OF THE DRAWINGS

Figure 1:
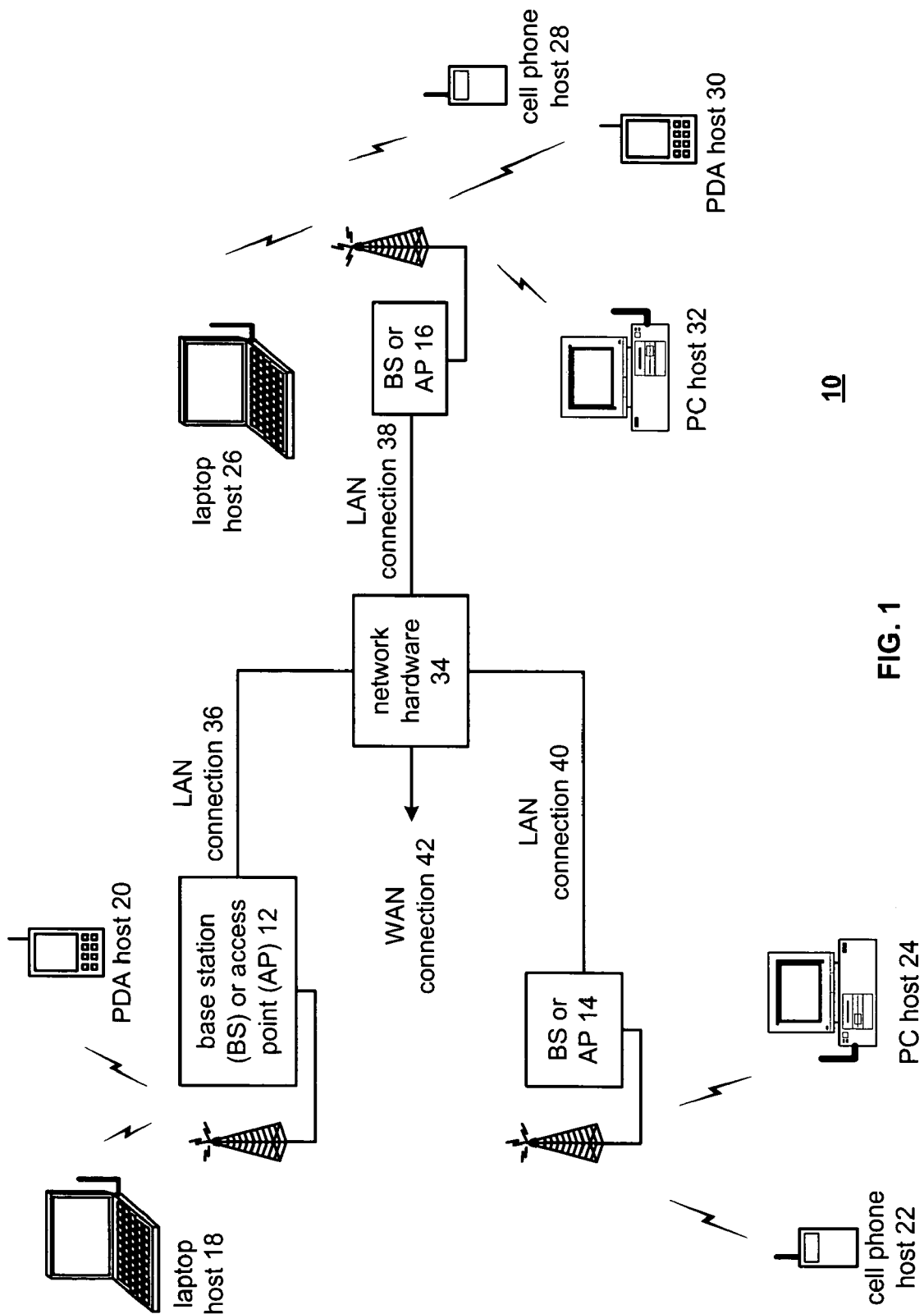
FIG. 1 is a schematic block diagram illustrating a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32, cellular telephone hosts 22 and 28, and/or any other type of device that supports wireless communications. The details of the wireless communication devices will be described with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifiers and/or programmable multi-stage amplifiers as disclosed herein to enhance performance, reduce costs, reduce size, and/or enhance broadband applications.

Figure 2:
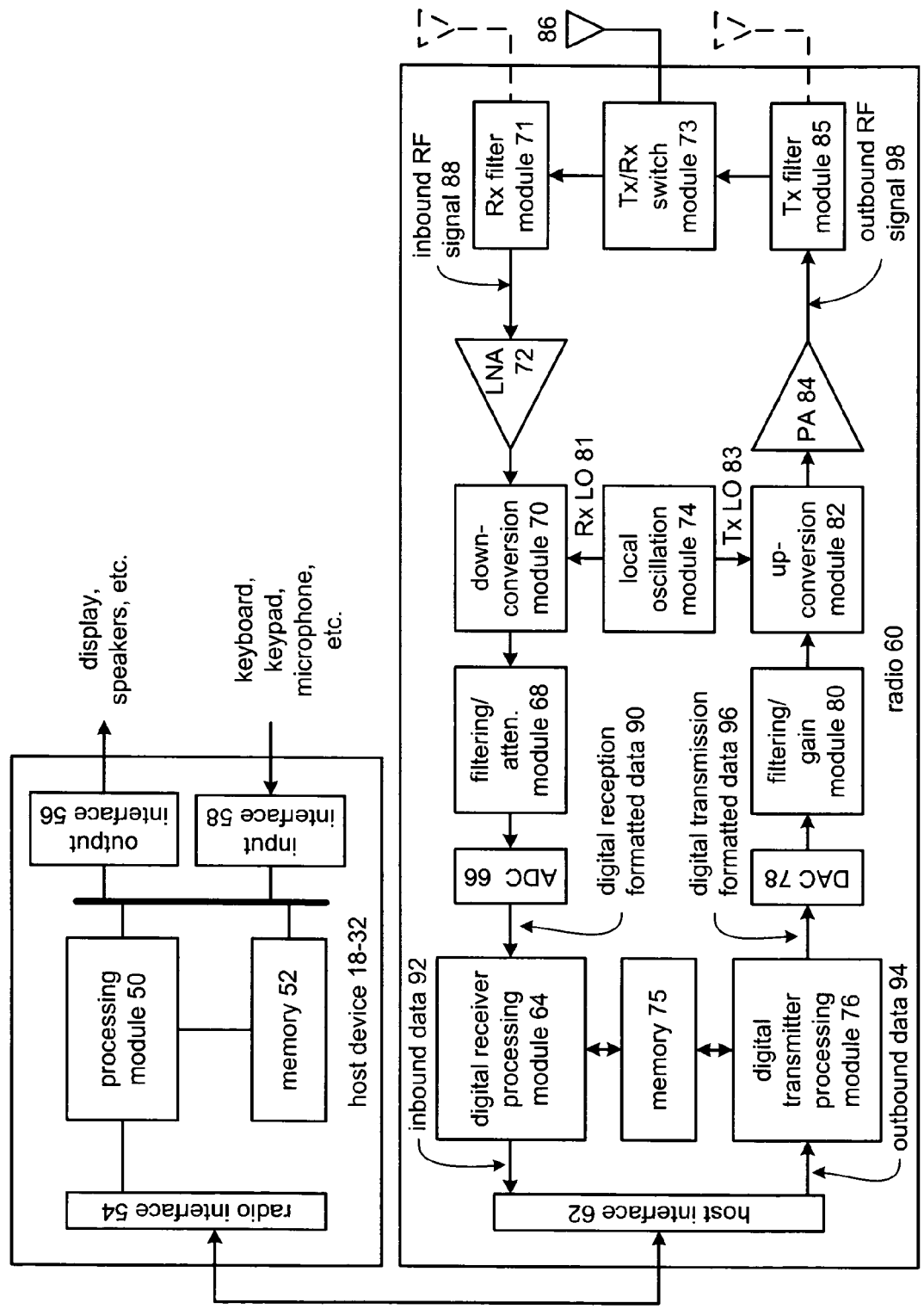
FIG. 2 is a schematic block diagram illustrating a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or may be an externally coupled component that couples to the host device 18-32 via a communication link, e.g., PCI interface, PCMCIA interface, USB interface, or another type of interface.

As illustrated, the host device 18-32 includes a processing module 50, memory 52, radio interface 54, input interface 58, and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera, such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain/attenuation module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 77, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes, operational instructions that facilitate functionality of the device. In some embodiments, the combination of the digital receiver processing module, the digital transmitter processing module, and the memory 75 may be referred to together as a "baseband processor."

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, IEEE802.11g, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain/attenuation module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 77, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain/attenuation module 68. The filtering/gain/attenuation module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
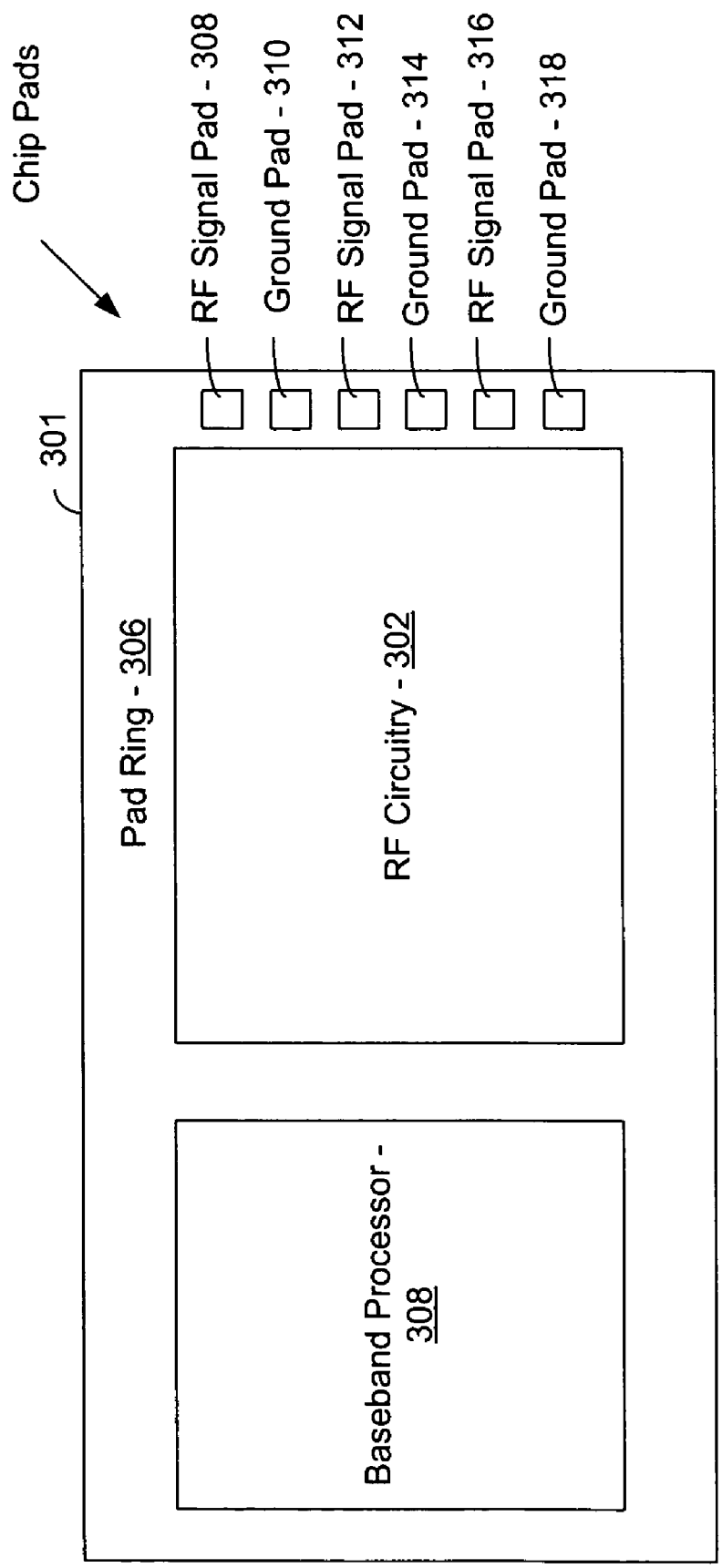
FIG. 3 is block diagram illustrating an RF transceiver having a padring that provides Electro Static Discharge (ESD) protection according to the present invention.

FIG. 3 is block diagram illustrating an RF transceiver having a padring 306 that provides Electro Static Discharge (ESD) protection according to the present invention. Generally, a padring is a ring of pads often located on the periphery of a semiconductor die which includes pads that are used to make electrical connections to external components via bond wires, down bonds, balls, etc. The integrated circuit 300 of FIG. 3 may be a particular embodiment of a radio frequency transceiver previously illustrated in FIG. 2 and contained within a wireless device of FIG. 1. The integrated circuit 300 is formed on a semi conductive substrate die 301 using techniques that are known, except as they may have been modified in accordance with the present invention. The integrated circuit 300 includes RF circuitry 302, a baseband processor 308, and a padring 306, all of which are formed on the semi conductive substrate die 301. The padring 306 includes a plurality of chip pads including RF signal pads 308, 312, 316, and ground pads 310, 314, and 318. The padring 306 and its equivalent circuit are illustrated further in FIGS. 4-5B and include additional components thereon illustrated and therewith described. The padring 306 is formed on a periphery of the semi conductive substrate die 300.

RF signal pads 308, 312, and 316 have RF signals produced thereat or coupled thereto. For example, referring to FIG. 2, antenna 86, via Tx/Rx switch module 73, couples RF signals from and/or to RF signal pads 308, 312, and 316. The signals produced at these RF signal pads 308, 312 and 316 may be differential or single-ended. Further, RF signal pads 308, 312, and 316 may in some embodiments be employed for tuning purposes. In such case, according to one embodiment of the present invention, a bond wire couples to between an RF signal pad and a package and forms an inductive element of an RF circuit of the RF circuitry 302. The use of a bond wire for such circuit tuning is illustrated further in FIGS. 7-10.

Figure 4:
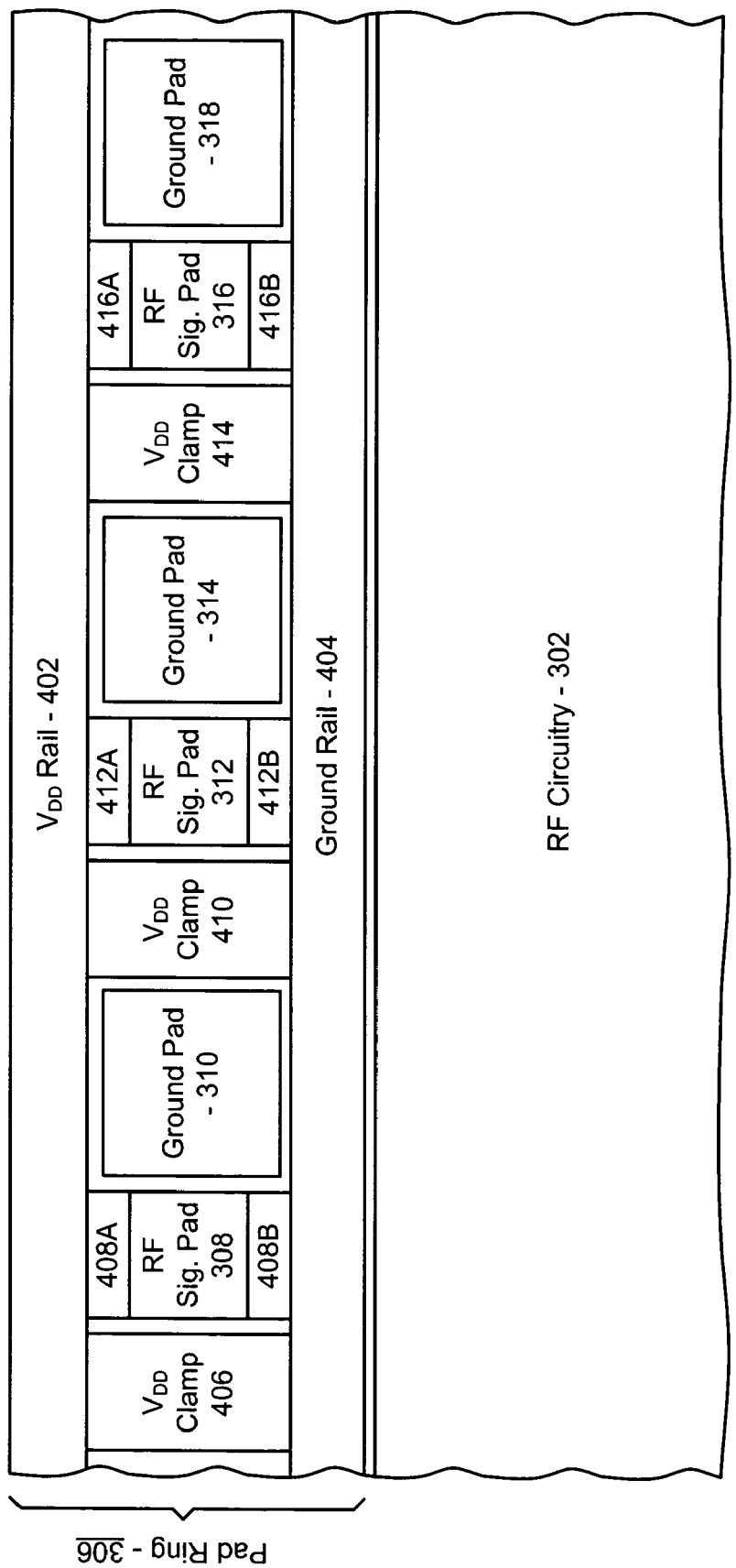
FIG. 4 is a partial diagrammatic top view illustrating in detail the padring of FIG. 3.
Figure 5:
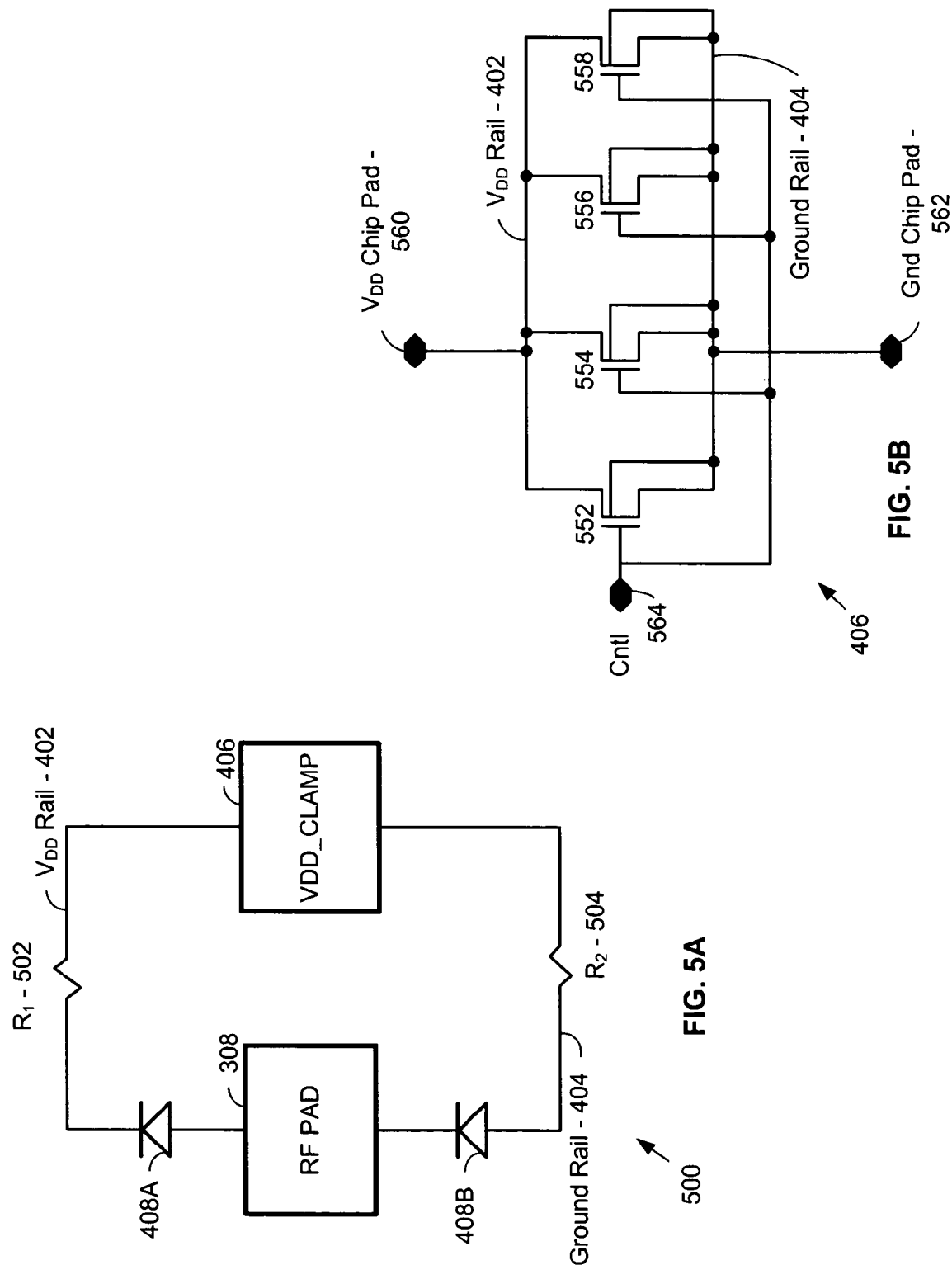
FIG. 5A is an equivalent circuit diagram of an ESD protection system constructed according to an embodiment of the present invention.
FIG. 5B is a circuit diagram of a voltage clamp of the ESD protection system of FIG. 5A.

FIG. 4 is a partial diagrammatic top view illustrating in detail the padring of FIG. 3. Referring now to FIG. 4, the padring 306 includes voltage supply ($V_{DD}$) rail 402, ground rail 404, and a plurality of signal pad structures disposed between the voltage supply rail 402 and the ground rail 404. Each signal pad structure includes a signal pad, a voltage supply path diode disposed between and coupled between the signal pad and the voltage supply rail, and a ground path diode disposed between and coupled between the signal pad and the voltage supply rail. Referring particularly to RF signal pad 308, the signal pad structure includes voltage supply path diode 408A and ground path diode 408B. Likewise, RF signal pad 312 includes voltage supply path diode 412A and ground path diode 412B. Further, RF signal pad 316 includes voltage supply path diode 416A and ground path diode 416B.

The padring 306 further includes a plurality of voltage clamps ($V_{DD}$ clamps) 406, 410, and 414 disposed between and coupled between the voltage supply rail 402 and the ground rail 404. The structure of the voltage clamp 406 will be described further with reference to FIG. 5B. As shown, each signal pad structure may have a corresponding voltage clamp formed adjacent thereto. As will be described further with reference to FIG. 5A, by locating a voltage clamp adjacent to a signal pad structure, the ESD protection characteristics of the padring 306 are significantly improved.

As is illustrated in FIG. 4, the voltage supply rail 402 resides on an outer perimeter of the semi conductive substrate die. Further, as is illustrated in FIG. 4, the ground rail 404 resides in an inner perimeter of the padring 306. As shown in FIG. 4, the RF circuitry 302 serviced by padring 306 resides on an inner portion of the semi conductive substrate die upon which the integrated circuit is formed.

FIG. 5A is an equivalent circuit diagram of an ESD protection system constructed according to an embodiment of the present. The equivalent circuit 500 of FIG. 5A refers particularly to a portion of the padring 306 having a signal pad structure that includes RF signal pad 308. The equivalent circuit 500 includes the RF pad 308, voltage supply path diode 408A, ground path diode 408B, and the voltage clamp 406. As shown, the voltage supply path diode 408 couples between RF pad 308 and the $V_{DD}$ rail 402 and protects over-voltages at RF pad 308. Likewise, ground path diode 408B couples between RF pad 308 and ground rail 404 and protects against under-voltages at RF pad 308. As is generally known, after an integrated circuit is constructed and prior to its packaging, the RF pads, e.g., RF pad 308 are extremely susceptible to ESD events because they are unterminated. Thus, the voltage supply path diode 408A and the ground path diode 408B protect circuitry coupled to the RF pad 308, e.g., RF circuitry 302 from such over and under voltage situations. The voltage clamp 406 protects against voltage differentials between the voltage supply rail 402 and the ground rail 404.

$R_1$-502 represents the resistance of a $V_{DD}$ metallization layer and a rail of the die as well as any various other resistances between the RF pad 308 and the $V_{DD}$\_Clamp 406 via the $V_{DD}$ rail 402. $R_2$-504 includes the resistances of the GND metallization layer of the die as well as any various other resistances between the RF pad 308 and the VDD\_CLAMP 406 via the Ground rail 404.

According to the present invention, the voltage supply path diode 408A and the ground path diode 408B provide ESD protection for the RF pad 308. In order to provide significant ESD protection at the RF pad 308, the voltage supply path diode 408A, and the ground path diode 408B are chosen and placed to minimize the circuit path resistances when conducting. Further, the voltage supply path diode 408A and the ground path diode 408B are selected to meet a predetermined parasitic capacitance budget at the RF signal pad 308. Moreover, the voltage supply path diode 408A and the ground path diode 408B are further selected to meet a maximum conductive resistance budget when not conducting during an ESD event.

In order to meet these budgeted circuit requirements, the ground path diode 408B and the voltage supply path diode 408A may have particular constructions. In one embodiment, at least one of the ground path diodes 408B and the voltage supply path diode 408A comprise an NDIO diode having an N+ contact performed in a P-type well. According to another embodiment, at least one of the ground path diodes 408B and the voltage supply path diode 408A comprises an NDIO diode having an N+ contact performed in a P-type substrate. Further, according to another particular construct, at least one of the ground path diode 408B and the voltage supply path diode 408A comprises a PDIO diode having a P+ contact performed in an N-type well. With these particular diode structures, the diodes have the appropriate threshold voltages/turn-on voltages with low ON resistances (not shown but inherent in the diode shown). Further, with the location of the voltage clamp 406 adjacent to signal pad structure including RF pad 308, voltage supply path diode 408A, and ground path diode 408B, $R_1$-502 and $R_2$-504 are further minimized. The location of the voltage supply rail 402 on the periphery of the semi conductive substrate die provides further protection for the integrated circuits in the RF circuitry 302 contained thereon.

FIG. 5B is a circuit diagram of a voltage clamp 406 of the ESD protection system of FIG. 5A. The voltage clamp 406 couples between $V_{DD}$ rail 402 and ground rail 404. As shown, the $V_{DD}$ rail 402 couples to a voltage supply chip pad 560. Likewise, the ground rail 404 couples to a ground chip pad 562. The voltage clamp 406 includes a plurality of transistors 552, 554, 556, and 558 coupled between the voltage supply rail 402 and the ground rail 404. As is shown, source terminals of transistors 552-558 couple to ground rail 404 while drain terminals of transistors 552-558 couple to voltage supply rail 402. Control pad 564 couples to gates of the transistors 552-558 enabling the transistors 552-558 to be turned on to thereby short the voltage supply rail 402 to the ground rail 404 during certain operations. According to one particular embodiment of the present invention, the plurality of transistors 552-558 comprise NMOS transistors.

Figure 6:
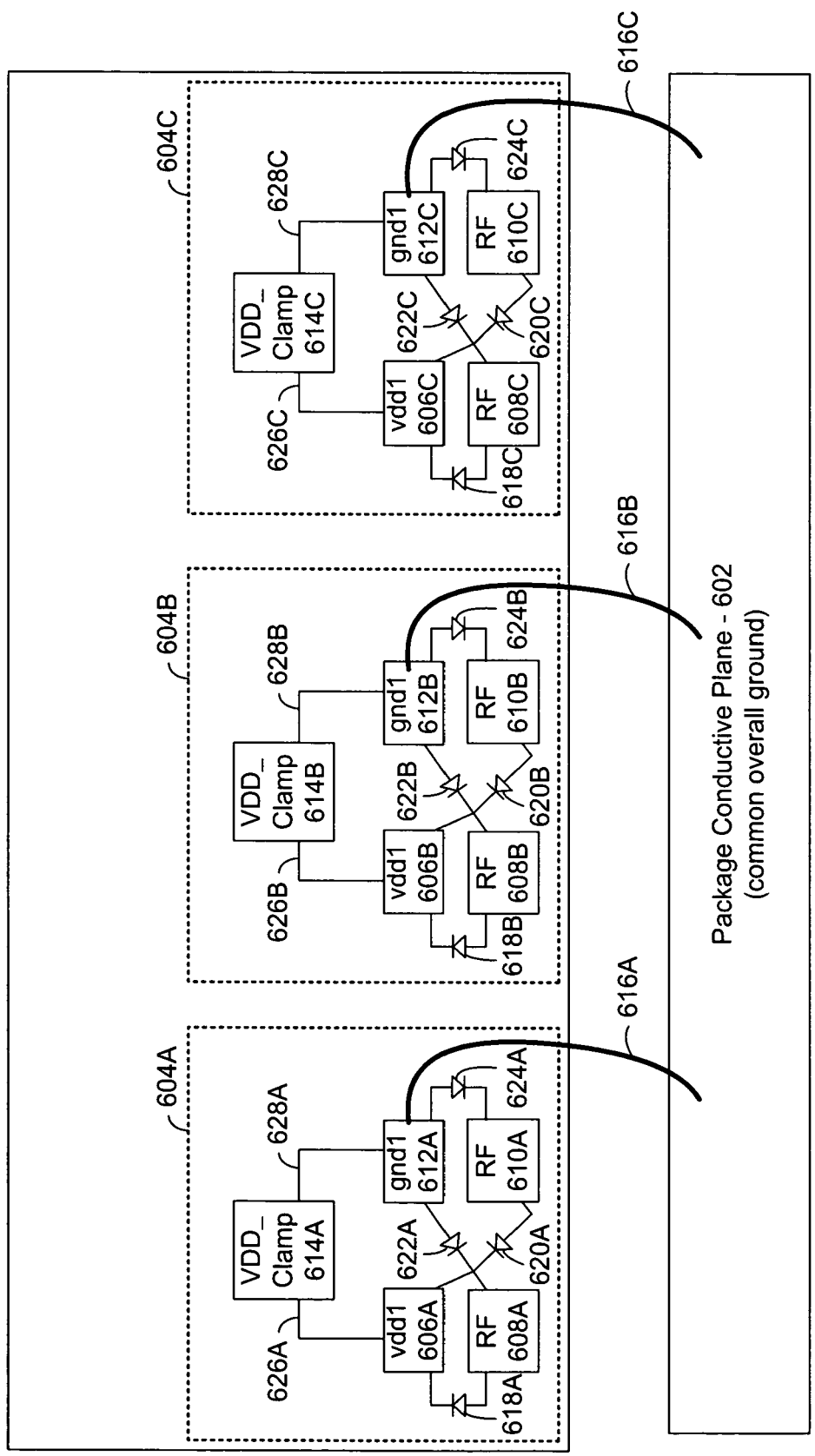
FIG. 6 is a diagrammatic view of another embodiment of an ESD protection system constructed according to an embodiment of the present invention.

FIG. 6 is a diagrammatic view of another embodiment of an ESD protection system constructed according to an embodiment of the present invention. The ESD protection system 600 protects an integrated circuit that is formed on a semi conductive substrate die prior to (and after) packaging of the semi conductive substrate die. The integrated circuit, e.g., RF circuit 302 illustrated in FIG. 3, includes a plurality of power domains 604A, 604B, and 604C. Each power domain 604A-604C corresponds to a respective portion of the integrated circuit. Referring particularly to power domain 604A, the power domain 604A includes at least one voltage supply pad 606A, at least one ground pad 612A, voltage supply rail 626A, a ground rail 628A, and a $V_{DD\_}$ Clamp 614A. The power domain 604A further includes signal pads 608A and 610A, voltage supply path diodes 618A and 620A coupled between the signal pads 608A and 610A and the voltage supply pad 606A. The power domain 604A also includes ground path diodes 620A and 622A coupled between signal pads 608A and 610A and ground pad 612A.

Likewise, power domain 604B at least one voltage supply pad 606B, at least one ground pad 612B, voltage supply rail 626B, a ground rail 628B, and a VDD_Clamp 614B. The power domain 604B further include signal pads 608B and 610B, voltage supply path diodes 618B and 620B coupled between the signal pads 608B and 610B and the voltage supply pad 606B. The power domain 604B also includes ground path diodes 620B and 622B coupled between signal pads 608B and 610B and ground pad 612B.

Further, power domain 604C at least one voltage supply pad 606C, at least one ground pad 612C, voltage supply rail 626C, a ground rail 628C, and a VDD_Clamp 614C. The power domain 604C further include signal pads 608C and 610C, voltage supply path diodes 618C and 620C coupled between the signal pads 608C and 610C and the voltage supply pad 606C. The power domain 604C also includes ground path diodes 620C and 622C coupled between signal pads 608C and 610C and ground pad 612C.

Each of the power domains 604A, 604B, and 604C corresponds to a respective portion of an integrated circuit that it protects. According to the present invention, the ground pads 612A, 612B, and 612C of the power domains 604A, 604B, and 604C, respectively, couple to a package conductive plane 602 via respective downbonds 616A, 616B, and 616C. As will be described further with reference to FIG. 7, the integrated circuit having the plurality of power domains 604A, 604B, and 604C mounts in/on a package that includes the package conductive plane 602. Because the package conductive plane 602 has significant conductive mass, it has low overall inductance such that the inductance between the plurality of power domains 604A, 604B, and 604C is low. Thus, the structure illustrated in FIG. 6 provides significant ESD protection between the power domains 604A-604C. By having the power domains 604A-604C couple via the package conductive plane 602 and corresponding downbonds 616A-616C, conventional individual ESD components between the power domains 604A-604C are not required.

Figure 7A:
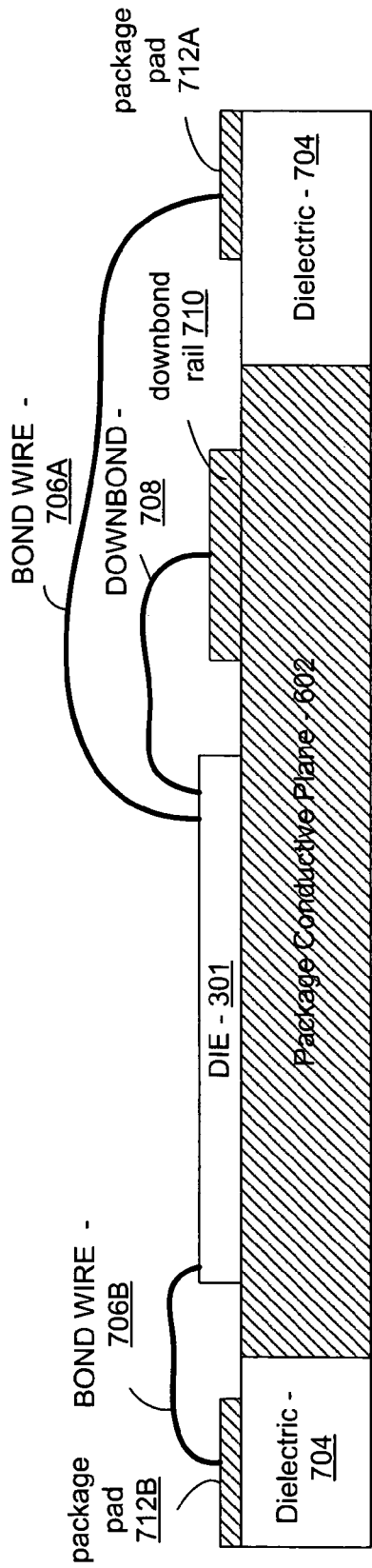
FIGS. 7A-7D are diagrammatic sectional side views of a packaged integrated circuit constructed according to various embodiments of the present invention.

FIG. 7A is a diagrammatic sectional side view of a packaged integrated circuit constructed according to an embodiment of the present invention. As shown in FIG. 7A, the semi conductive substrate die 301 mounts upon package conductive plane 602. The package conductive plane 620 of FIG. 7A is a heat slug. The package conductive plane 602 is formed in a package that also includes dielectric portions 704. Formed upon package conductive plane 602 is downbond rail 710. Downbond 708 (one among many) couples between a chip pad formed on the semi conductive substrate die 301 and downbond rail 710. The package also includes package pads 712A and 712B. These package pads 712A and 712B couple via bond wires 706A and 706B to chip pads. While only a single downbond 708 is shown, each power domain (604A, 604B, and 604C of FIG. 3) will have at least one downbond that couples a ground rail and/or ground pad of the power domain to the package conductive plane 602 via the downbond rail 702.

Referring to both FIG. 3 and FIG. 7A, RF signal pads 308, 312, and/or 316 couple to package pads via bond wires 706A and/or 706B. As will be described further with reference to FIGS. 8-9, bond wires 706A and/or 706B may be used as inductors within tuned circuits, which may be tuned RF circuits. When serving as inductors, the bond wires 706A and 706B have high quality (Q), typically higher Q than spiral conductors formed in/on the integrated circuit. However, prior to packaging of the semi conductive substrate die 710 circuits connected to the chip pads (signal pads) that later couple to bond wire 706A, for example, are very susceptible to ESD events. Because of the operational requirements of circuits (typically large voltage swing requirements) that use bond wires 706A or 706B for tuning, voltage supply path diodes and ground path diodes cannot be used. These principles apply to FIGS. 7B, 7C, and 7D, as well.

Figure 7B:
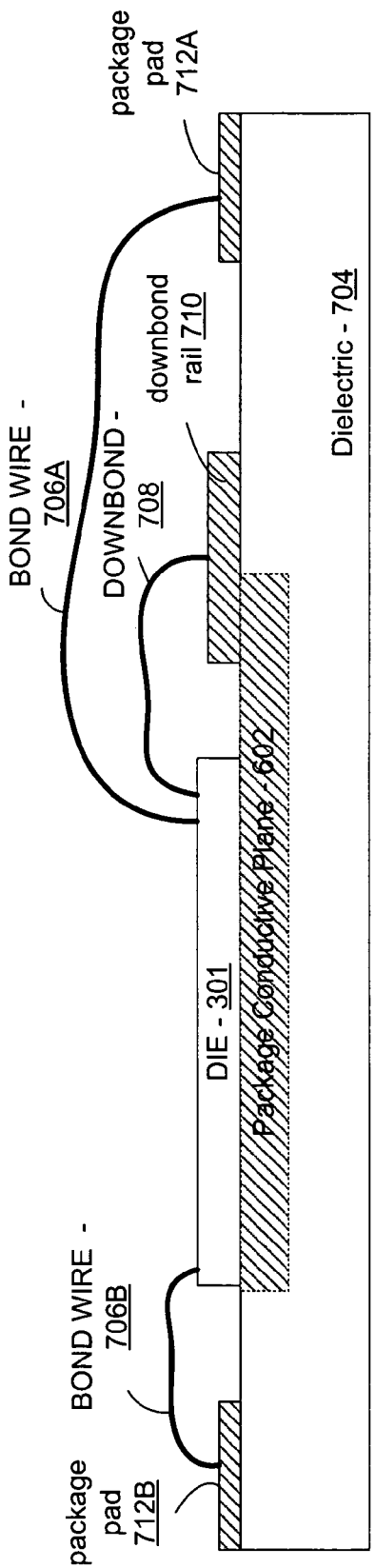

FIG. 7B is a diagrammatic sectional side view of a packaged integrated circuit constructed according to another embodiment of the present invention. The embodiment of FIG. 7A is similar to that of FIG. 7B. However, with the embodiment of FIG. 7B, the package conductive plane 602 does not exist as it does in FIG. 7A. Instead, the package conductive plane 602 extends partially through the dielectric 704.

Figure 7C:
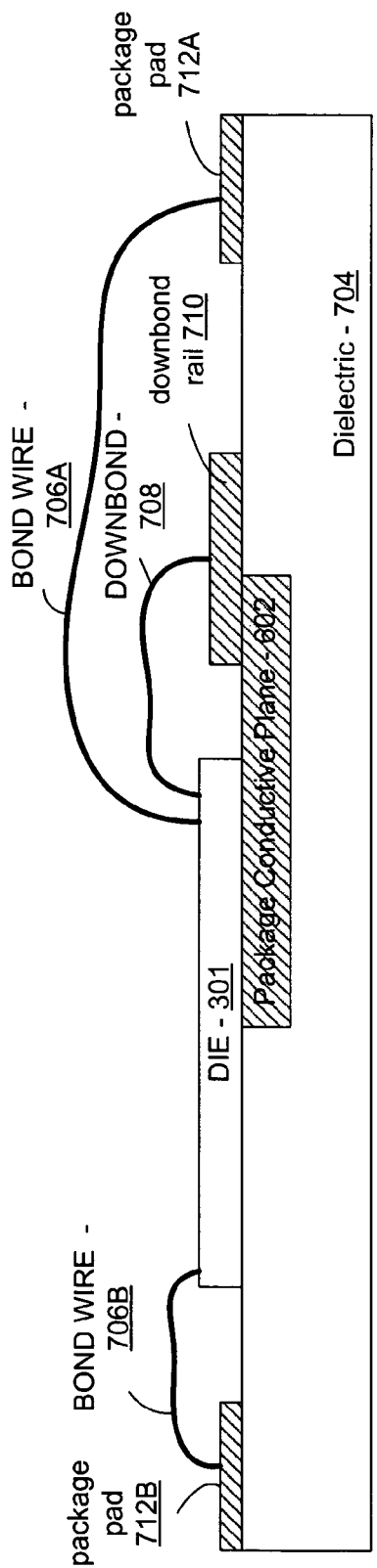

FIG. 7C is a diagrammatic sectional side view of a packaged integrated circuit constructed according to still another embodiment of the present invention. With the structure of FIG. 7C, the package conductive plane 602 extends partially through and across the dielectric 704 of the package below the die 301. In the embodiment of FIG. 7C, the package conductive plane 602 may be a strip residing below the die 301 upon the dielectric 704, may be a strip formed within the dielectric 704, may extend partially below the die 301, fully below the die 301, adjacent to the die 301, or in another configuration with respect to the die.

Figure 7D:
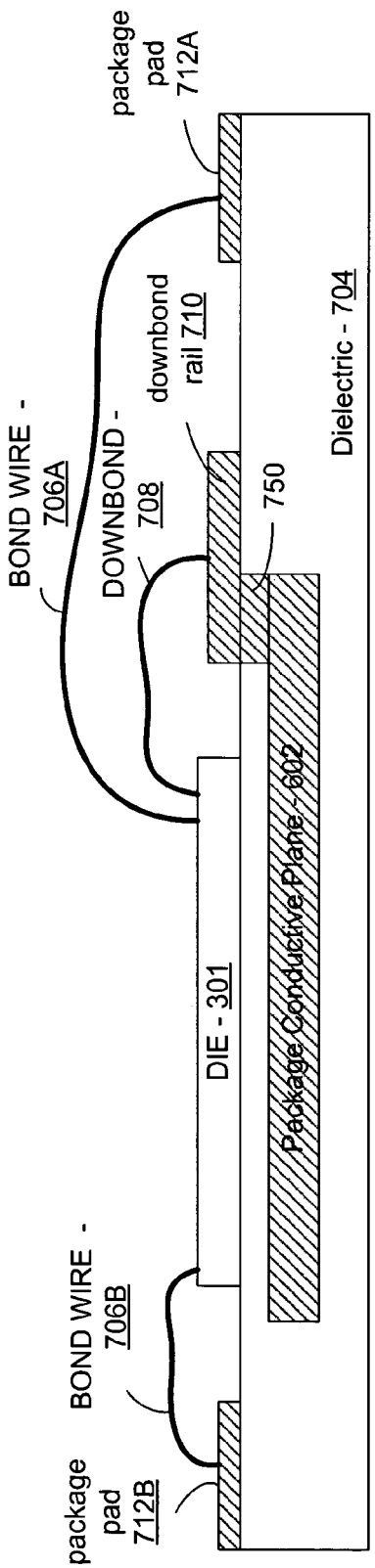

FIG. 7D is a diagrammatic sectional side view of a packaged integrated circuit constructed according to still a further embodiment of the present invention. With the structure of FIG. 7D, the package conductive plane 602 extends partially through and across the dielectric 704 of the package and is separated from the die 301 by dielectric. The package conductive plane 602 couples to the downbond rail 710 via conductor 750.

Figure 8:
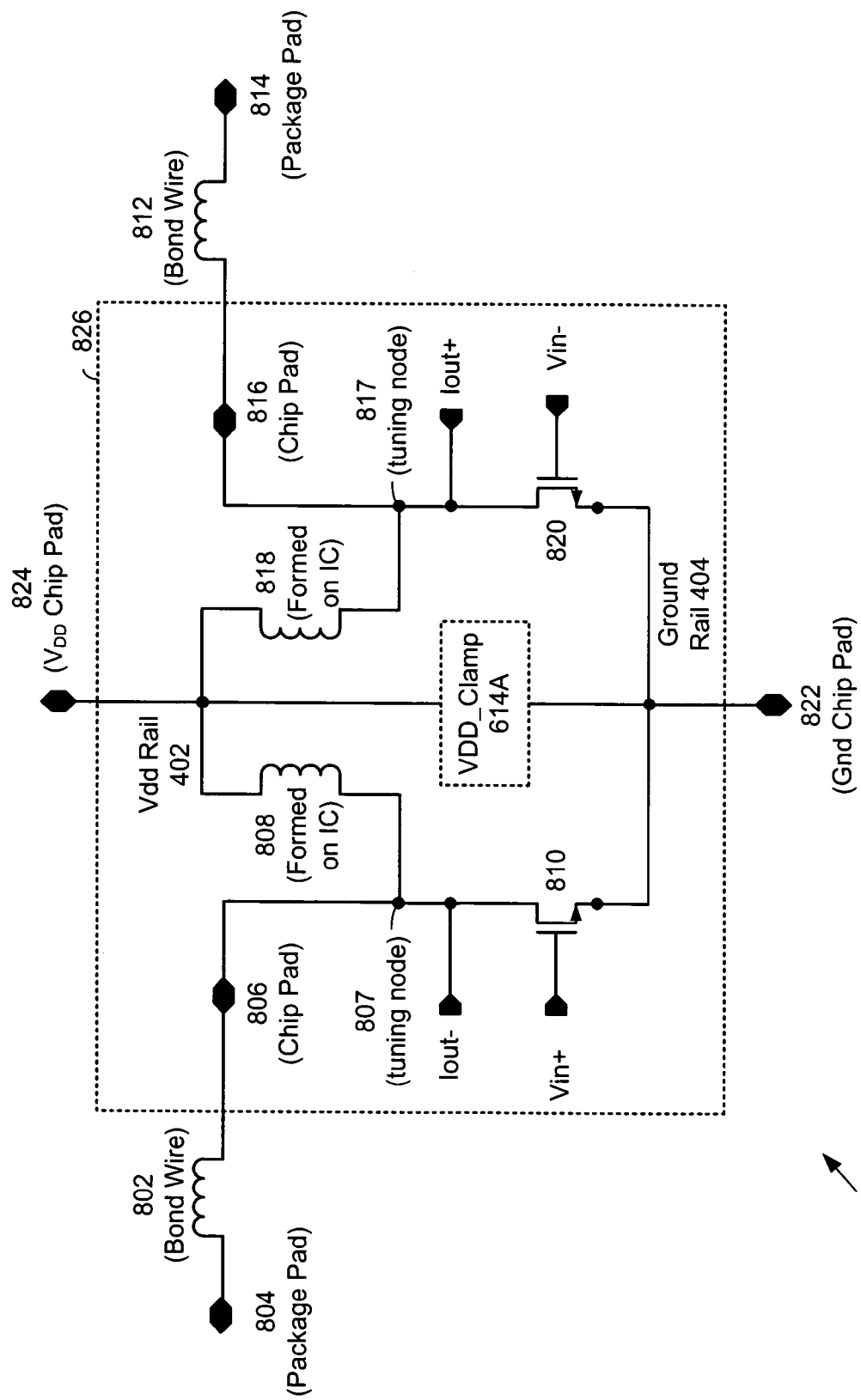
FIG. 8 is a circuit diagram of a differential circuit having ESD protection according to an embodiment of the present invention.

FIG. 8 is a circuit diagram of a differential circuit having ESD protection according to an embodiment of the present invention. In one embodiment, the differential circuit 800 operates upon an RF information signal. However, in other embodiments, the differential circuit 800 operates upon other types of information signals. The differential circuit 800 includes a plurality of circuit components 826 formed on a semi conductive substrate die. These circuit components 826 include at least one active component that operates on an information signal, a tuning node, an ESD protection inductor, and a chip pad coupled to the tuning node. With the embodiment of FIG. 8, the at least one active component of the differential circuit includes transistors 810 and 820. These transistors 810 and 820 have their source terminals coupled to ground rail 404 and their drain terminals coupled to tuning nodes 807 and 817, respectively. Ground rail 404 couples to a ground chip pad 822 via appropriate conductor. ESD protection inductors 808 and 818 couple between tuning nodes 807 and 817, respectively, and voltage supply rail 402.

In one particular embodiment of the present invention, ESD protection inductors 808 and 818 are formed as spiral inductors in a plurality of metal layers upon the semi conductive substrate die. Tuning nodes 807 and 817 couple to chip pads 806 and 816, respectively. After packaging of the semi conductive substrate die, RF chip pad 806 couples to RF package pad 804 via a bond wire 802. Likewise, after packaging, RF chip pad 816 couples to RF package pad 814 via bond wire 812. These bond wires 802 and 812 (706A and 706B in FIGS. 7A and 7B) serve as tuning or "choke" inductors for the circuit. Choke inductors provide DC current but provide high impedance or possibly an "open circuit" for RF signals. VDD rail 402 couples to $V_{DD}$ chip pad 824.

Prior to packaging of the semi conductive substrate die, or in some cases prior to mounting the packaged die in a Printed Circuit (PC) board, the plurality of circuit components 826 are susceptible to ESD events at RF chip pads 806 and 816. Further, the plurality of circuit components 826 may also be susceptible to ESD events at voltage supply chip pad 824 and ground chip pad 822. In order to protect the circuit component 826 from ESD events at voltage supply chip pad and ground chip pad 822, a voltage clamp 614A may be included. However, the voltage clamp 614A does not provide sufficient ESD protection at tuning nodes 807 and 817 (corresponding to chip pads 806 and 816, respectively). Thus, according to the present invention, the ESD protection inductors 808 and 818 provide ESD protection prior to packaging of the semi conductive substrate die and coupling of bond wires 802 and 812. With the circuit completely formed, the ESD protection inductors 808 and 818 operate in conjunction with bond wires 802 and 812 for tuning purposes of the circuit. Because the ESD protection inductors 808 and 818 have a substantially lower quality (Q) than do the bond wires 802 and 812, the ESD protection inductors 808 and 818 do not adversely affect the tuning aspects of the circuit 800.

According to some aspects of the present invention, the package includes a package ground that may be the package conductive plane 602 previously described with reference to FIGS. 7A and 7B. At such case, the downbond rail 708 may couple to the package conductive plane 602 upon which the semi conductive die 301 mounts. According to the embodiment of FIG. 8, the tuning node 807 couples to voltage supply rail 824 via the ESD protection inductor 808. Further, tuning node 817 couples to voltage supply rail 824 via ESD protection inductor 818. As will be further described with reference to FIG. 9, in another embodiment of the present invention, the tuning inductor and the ESD protection inductor may alternately couple from a tuning node to a ground rail.

According to a particular embodiment of the present invention, the circuit operates upon an RF signal. In such case, the information signal is therefore an RF signal. The circuit may be an RF power amplifier in which amplification of the RF signal is performed. With the particular embodiment of FIG. 8, the circuit serves as a transconductance device that receives a differential voltage input signal and produces a differential output current signal. This particular circuit may serve as the transconductance stage of an RF power amplifier. Particularly, the RF power amplifier may be a cascode power amplifier as described in pending patent application Ser. No. 10/800,237, filed on Mar. 12, 2004 and assigned to a common assignee.

Figure 9:
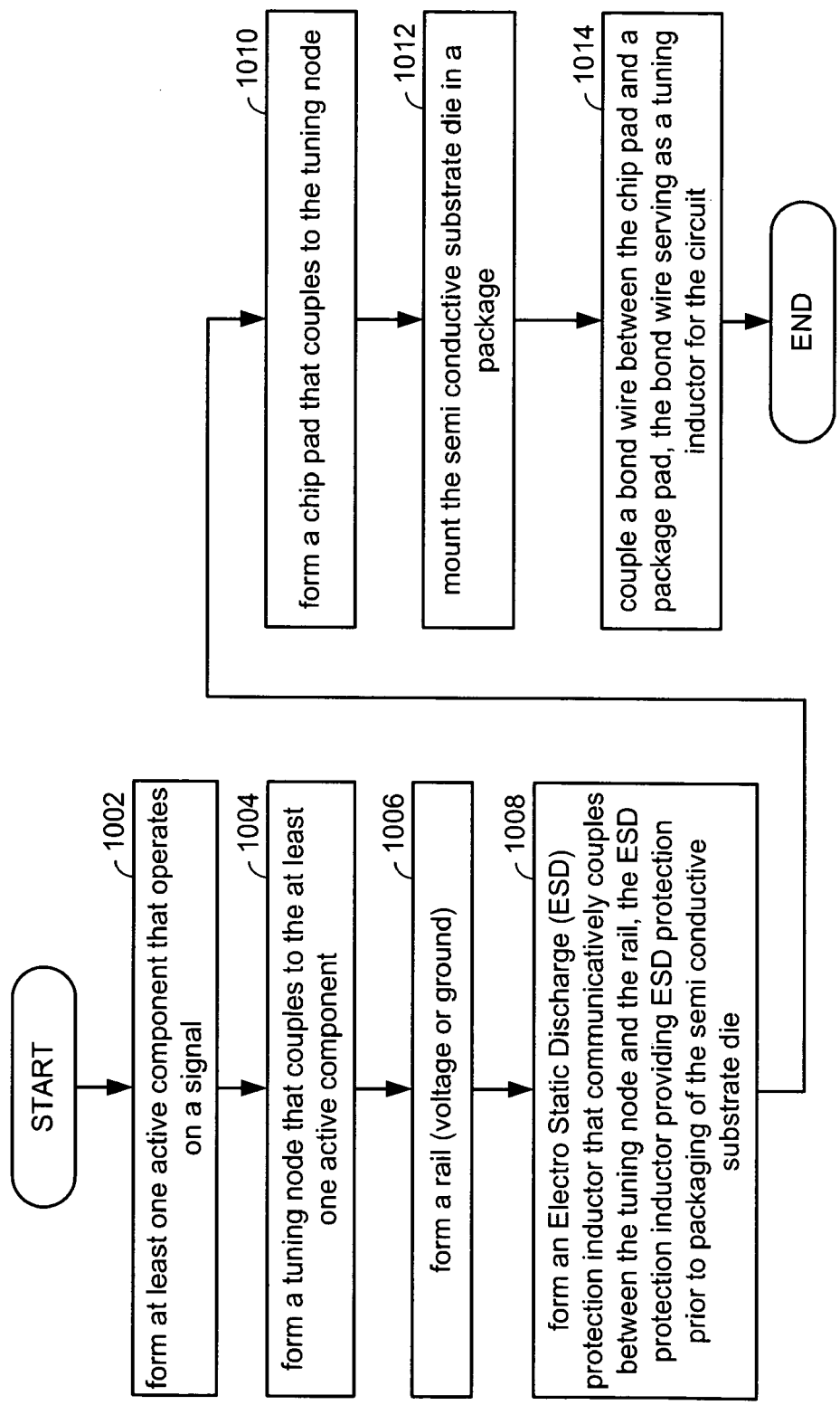
FIG. 9 is a flow diagram illustrating operation for constructing a circuit having ESD protection according to an embodiment of the present invention.

FIG. 9 is a flow diagram illustrating operation for constructing a circuit having ESD protection according to an embodiment of the present invention. The method 1000 includes first forming at least one active component that operates on an information signal on a semi conductive substrate die (step 1002). Forming the active components on the semi conductive substrate die includes forming a tuning node that couples to the at least one active component (step 1004). Further, such formation includes forming a padring that includes a rail (step 1006). This rail, depending upon the particular embodiment of the circuit, will be a voltage rail or a ground rail. However, as should be apparent to the reader, formation of the padring will include forming both a voltage rail and a ground rail. A particular embodiment of this padring is illustrated in FIG. 4.

Forming the plurality of circuit components on the semi conductor substrate die also includes forming an ESD protection inductor that communicatively couples between the tuning node and the rail (step 1008). The ESD protection inductor provides ESD protection prior to packaging of the semi conductive substrate die. In forming the plurality of circuit components to the semi conductive substrate die, the method includes forming a chip pad that couples to the tuning node via a conductor (step 1010). As the reader should appreciate, steps 1002 and 1010 are not required to be performed in the particular order illustrated in FIG. 10. The construction of an integrated circuit upon a semi conductive substrate die includes, in various embodiments, forming wells, forming components in the wells, forming components in the semi conductive substrate die, forming insulation layers above circuit components, forming metallization layers, forming insulation layers between the metallization layers, forming vias, and a number of other steps. Thus, the order of the steps and the particular steps illustrated in FIG. 10 does not limit the particular methodology for constructing an integrated circuit according to the present invention. These steps are called out in particularly only to educate the reader in how a circuit of the present invention may be constructed.

After the semi conductive substrate die has been constructed, the semi conductive substrate die is mounted into a package (step 1012). This particular package construct may take on any of a number of various forms that are generally known. One such construct is illustrated particularly in FIG. 7 to include the components shown thereon. After the semi conductive die is mounted in the package, a bond wire is coupled between the chip pad and a package pad (step 1014). The bond wire has chosen the tuning inductor for the circuit and has a substantially higher quality than does the ESD protection inductor formed at step 1008. With the semi conductive substrate die mounted in the package and the connections between the chip pads and the package pads completed, the circuit is complete. The package may be mounted in a wireless terminal as an RF transceiver, for example. This RF transceiver was shown in FIG. 2 and is a component in a wireless terminal such as those illustrated in FIG. 1.

As one of average skill in the art will appreciate, the term "substantially" or "approximately," as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled." As one of average skill in the art will further appreciate, the term "compares favorably," as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A padring formed on a semi conductive substrate die to provide Electro Static Discharge (ESD) protection for a Radio Frequency (RF) circuit also formed on the semi conductive substrate die, the padring comprising:

a voltage supply rail disposed on an outer perimeter of the semi conductive substrate die and bordering around the RF circuit;

a ground rail disposed on an inner perimeter of the semi conductive substrate die and also bordering around the RF circuit, the ground rail residing substantially parallel to the voltage supply rail;

a plurality of signal pad structures disposed between the voltage supply rail and the ground rail, each signal pad structure comprising:

a signal pad disposed between the voltage supply rail and the ground rail, in which the signal pad couples to the RF circuit;

a voltage supply path diode disposed between and coupled to the signal pad and the voltage supply rail; and a ground path diode disposed between and coupled to the signal pad and the ground rail; and a plurality of voltage clamps disposed between and coupled to the voltage supply rail and the ground rail and disposed adjacent to respective signal pad structure on the semi conductive substrate die, wherein the voltage clamps, voltage supply rail, ground rail and the signal pad structures are formed at a periphery of the semi conductive substrate die and on a border of the RF circuit.

2. The padring of claim 1, wherein at least one of the ground path diode and the voltage supply path diode comprises an NDIO diode having an N+ contact formed in P type well.

3. The padring of claim 1, wherein at least one of the ground path diode and the voltage supply path diode comprises an NDIO diode having an N+ contact formed in P type substrate.

4. The padring of claim 1, wherein at least one of the ground path diode and the voltage supply path diode comprises an PDIO diode having an P+ contact formed in N type well.

5. The padring of claim 1, wherein each voltage clamp comprises a plurality of transistors coupled between the voltage supply rail and the ground rail.

6. The padring of claim 5, wherein the plurality of transistors comprise a plurality of NMOS transistors.

7. The padring of claim 1, wherein the voltage supply path diode and the ground path diode are selected to meet a predetermined parasitic capacitance budget at the signal pad.

8. The padring of claim 7, wherein the voltage supply path diode and the ground path diode are further selected to meet a maximum conductive resistance budget.

* * * * *